(12) United States Patent
Sasaki et al.

(10) Patent No.: US 7,835,141 B2
(45) Date of Patent: Nov. 16, 2010

(54) ELECTRIC POWER DISTRIBUTION SYSTEM

(75) Inventors: Yoshikazu Sasaki, Yokkaichi (JP);
Yukinori Kita, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/585,335

(22) Filed: Sep. 11, 2009

(65) Prior Publication Data

US 2010/0039753 A1     Feb. 18, 2010

Related U.S. Application Data

(62) Division of application No. 11/578,936, filed as application No. PCT/JP2006/307669 on Apr. 11, 2006, now Pat. No. 7,639,476.

(30) Foreign Application Priority Data

| Apr. 11, 2005 | (JP) | ............... 2005-113123 |
| Jun. 9, 2005 | (JP) | ............... 2005-169692 |
| Sep. 2, 2005 | (JP) | ............... 2005-254651 |

(51) Int. Cl.
*H02B 1/04* (2006.01)

(52) U.S. Cl. ............. 361/641; 361/642; 361/643; 174/50

(58) Field of Classification Search ............... None
See application file for complete search history.

(56) References Cited

U.S. PATENT DOCUMENTS

| 5,088,010 | A | 2/1992 | Wimmer et al. |
| 6,443,748 | B1 | 9/2002 | Yuasa |
| 6,445,568 | B1 | 9/2002 | Baur et al. |
| 6,465,905 | B1 | 10/2002 | Tsubaki |
| 6,774,309 | B2 | 8/2004 | Kasai |
| 6,787,698 | B2 | 9/2004 | Higuchi et al. |
| 6,911,598 | B2 | 6/2005 | Onizuka et al. |
| 6,982,379 | B2 | 1/2006 | Saka et al. |
| 7,099,155 | B2 | 8/2006 | Kobayashi et al. |
| 7,209,360 | B1 | 4/2007 | Yarza |
| 7,408,765 | B2 | 8/2008 | Kanou |
| 2003/0137813 | A1 | 7/2003 | Onizuka et al. |
| 2004/0004816 | A1 | 1/2004 | Yamaguchi et al. |

FOREIGN PATENT DOCUMENTS

JP     U-04-88317     7/1992

(Continued)

*Primary Examiner*—Boris L Chervinsky
(74) *Attorney, Agent, or Firm*—Oliff & Berridge, PLC

(57) ABSTRACT

There is a concern that water on the top surface of a cover 50A will penetrate the top face of a case 20 through gaps between an opening portion 51H and parts accommodation portions 34 because the parts accommodation portions 34 are exposed to the outside at the opening portion 51H on the top face of the cover 50A while the electrical connection box P is positioned in the cover 50A. Because drainage grooves 35 and 36, which reach the drainage channels 38 on the outside face of the case 20, are formed on the top face of the case 20, water that remains on the top face of the case 20 (the main body portion 30) is reliably drained by flowing into the drainage grooves 35 and 36.

5 Claims, 16 Drawing Sheets

FOREIGN PATENT DOCUMENTS

| | | |
|---|---|---|
| JP | A-08-212874 | 8/1996 |
| JP | A 10-35375 | 2/1998 |
| JP | A-2000-23332 | 1/2000 |
| JP | A 2000-59953 | 2/2000 |
| JP | A-2001-118628 | 4/2001 |
| JP | 2001-238327 A | 8/2001 |
| JP | A 2002-152943 | 5/2002 |
| JP | A 2003-164039 | 6/2003 |
| JP | A 2003-224918 | 8/2003 |
| JP | 2004-096968 A | 3/2004 |
| JP | A 2004-312842 | 11/2004 |

ELECTRIC POWER DISTRIBUTION SYSTEM

This is a Division of application Ser. No. 11/578,936 filed Oct. 19, 2006. The disclosure of the prior application is hereby incorporated by reference herein in its entirety.

TECHNICAL FIELD

The present invention relates to an electric power distribution system.

BACKGROUND ART

An example of an electric power distribution system mounted in an automobile is one that houses an electrical connecting box in a housing shaped cover. The electrical connection box has a structure in which a circuit assembly is accommodated in a case, and the circuit assembly is structured to include a circuit board, bus bars that are wired along the reverse face of the circuit board, and switching members such as relays and the like that are mounted on the obverse side of the circuit board. The case is structured to include a frame shaped member that is disposed and secured along the outside perimeter of the circuit board, a cover that is mounted so as to cover the circuit board from the obverse side in relation to the frame, and a heat sink that is affixed to the reverse face of the circuit board and that covers the opening on the reverse side of the frame.

Note that an example of such an electrical connection box is disclosed in Japanese Patent Application Publication No. JP-A-2003-164039.

In this type of electric power distribution system, parts accommodation portions that are formed on the top face of the frame shaped member are formed so as to be exposed from the opening portion of the top face of the cover, and thereby, attachment and detachment of parts (for example, fuses) in the parts accommodation portions is simplified.

However, in a structure in which the parts accommodation portions are exposed in the opening portion of the cover, there is a concern that water remaining on the top face of the cover due to condensation and the like may penetrate inside the cover through gaps between the opening portion and the parts accommodation portions, and may thereby adhere to the outside face (the top face of the frame shaped member) of the electrical connection box. In this case, there is a concern that water will penetrate inside the electrical connection box through the gaps between the parts that form the case, and as a result, short-circuits and the like will occur in the circuit assembly.

SUMMARY OF THE INVENTION

The present invention has been completed in view of the circumstances described above. It is an object of the present invention to increase the water drainage efficiency on the top face of the electrical connection box.

The electric power distribution system of the present invention is provided with an electrical connection box that is furnished with parts accommodation portions on the top face that enable the attachment and detachment of parts, and a cover that can be mounted on the electrical connection box so as to cover at least the portion that excludes the parts accommodation portions on the top face thereof, and drainage grooves that are provided on the top face of the electrical connection box extend to the outside face of the electrical connection box.

In this structure, while the cover mounted on the electrical connection box covers the top face of the electrical connection box, because the parts accommodation portions are exposed on the outside face of the cover, there is a concern that water adhering to the top face of the cover may flow inside the top face of the electrical connection box through gaps between the opening portion of the cover and the parts accommodation portions.

However, in the present invention, because drainage grooves are formed on the top face of the electrical connection box that extend to the outside face thereof, the water remaining on the top face of the electrical connection box flows into the drainage grooves, and thereby is drained to the outside face side of the electrical connection box.

According to the present invention, water that has flowed into the top face of the electrical connection box by penetrating through the gap between the cover and the parts accommodation portions can be reliably drained, and thus there is no concern that the water will remain on the top face of the electrical connection box.

DESCRIPTION OF THE REFERENCE NUMERALS

Figure 1:
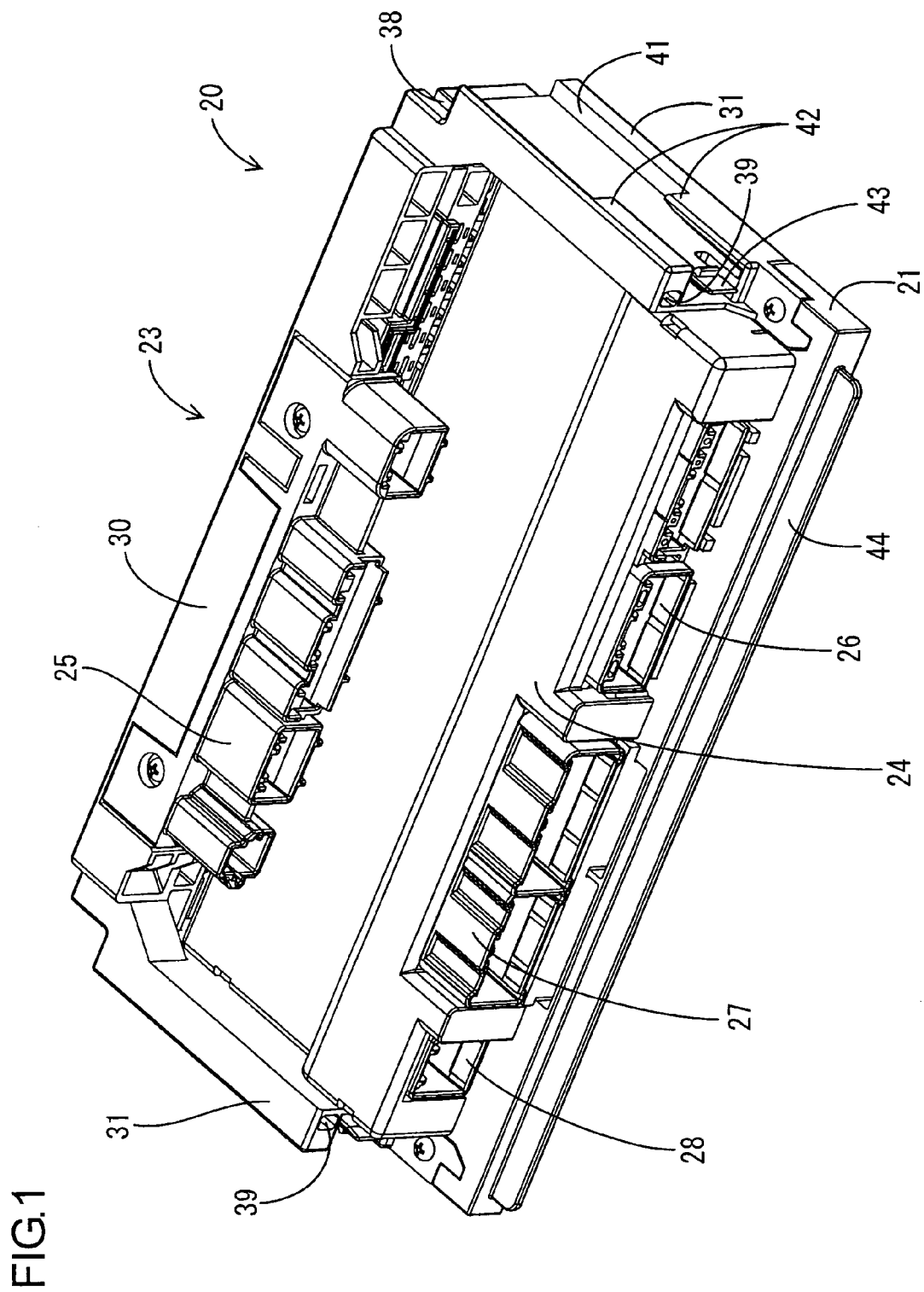
FIG. 1 is a perspective view showing the state of attachment of an electrical connection box of a first illustrative example.

| Description of the Reference Numerals | |
|---|---|
| P | ELECTRICAL CONNECTION BOX |
| 10 | CIRCUIT ASSEMBLY |
| 11 | CIRCUIT BOARD |

-continued

Description of the Reference Numerals

| | |
|---|---|
| 12 | BUS BARS |
| 13 | SWITCHING MEMBERS |
| 14 | FIRST TERMINAL PORTIONS |
| 15 | SECOND TERMINAL PORTIONS |
| 20 | CASE |
| 21 | FRAME |
| 22 | HEAT SINK |
| 23 | FUSE BLOCK |
| 24 | COVER PLATE |
| 25 | FIRST HOUSING |
| 26 | SECOND HOUSING |
| 27 | THIRD HOUSING |
| 28 | FOURTH HOUSING |
| 29 | RIB-SHAPED ROCKING RESTRICTING PORTIONS |
| 30 | MAIN BODY PORTION |
| 31 | ARM PORTION |
| 34 | PARTS ACCOMMODATION PORTION (POSITIONING PORTION) |
| 35, 35F, 35R, 35S | FIRST DRAINAGE GROOVE |
| 36 | SECOND DRAINAGE GROOVE |
| 37, 37A, 37F, 37R, 37S | INCLINED FACE |
| 38 | DRAINAGE CHANNEL |
| 39 | DRAINAGE OUTLETS |
| 40 | GROOVE-SHAPED ROCKING RESTRICTING PORTIONS |
| 41 | TILTING RESTRICTING PORTIONS |
| 42 | PRESSING RIBS |
| 43 | ELASTIC ENGAGING PIECES |
| 43A | ENGAGEMENT PROJECTIONS |
| 44 | FITTING PLATE |
| 50A | COVER |
| 51A | PLATE PORTION |
| 51H | OPENING PORTION |
| 52 | TUBULAR FITTING PORTION(POSITIONING PORTION) |
| 52a | WATER BARRIER WALL |
| 52b | GUIDING PORTION |
| 53 | TILTING RESTRICTING PORTION |
| 54 | SUPPORTING BLOCK PORTION |
| 55 | RESTRICTING RIBS |
| 56 | LEAK-OFF GROOVE |
| 57 | ENGAGING PORTION |
| 58 | BOTTOM LID |
| 59 | FITTING GROOVE |
| 60, 63F, 63R | COMMUNICATION GROOVE |
| 64 | INCLUDED FACES |
| 65 | RIDGE LINE |

Illustrative Example 1

Figure 2:
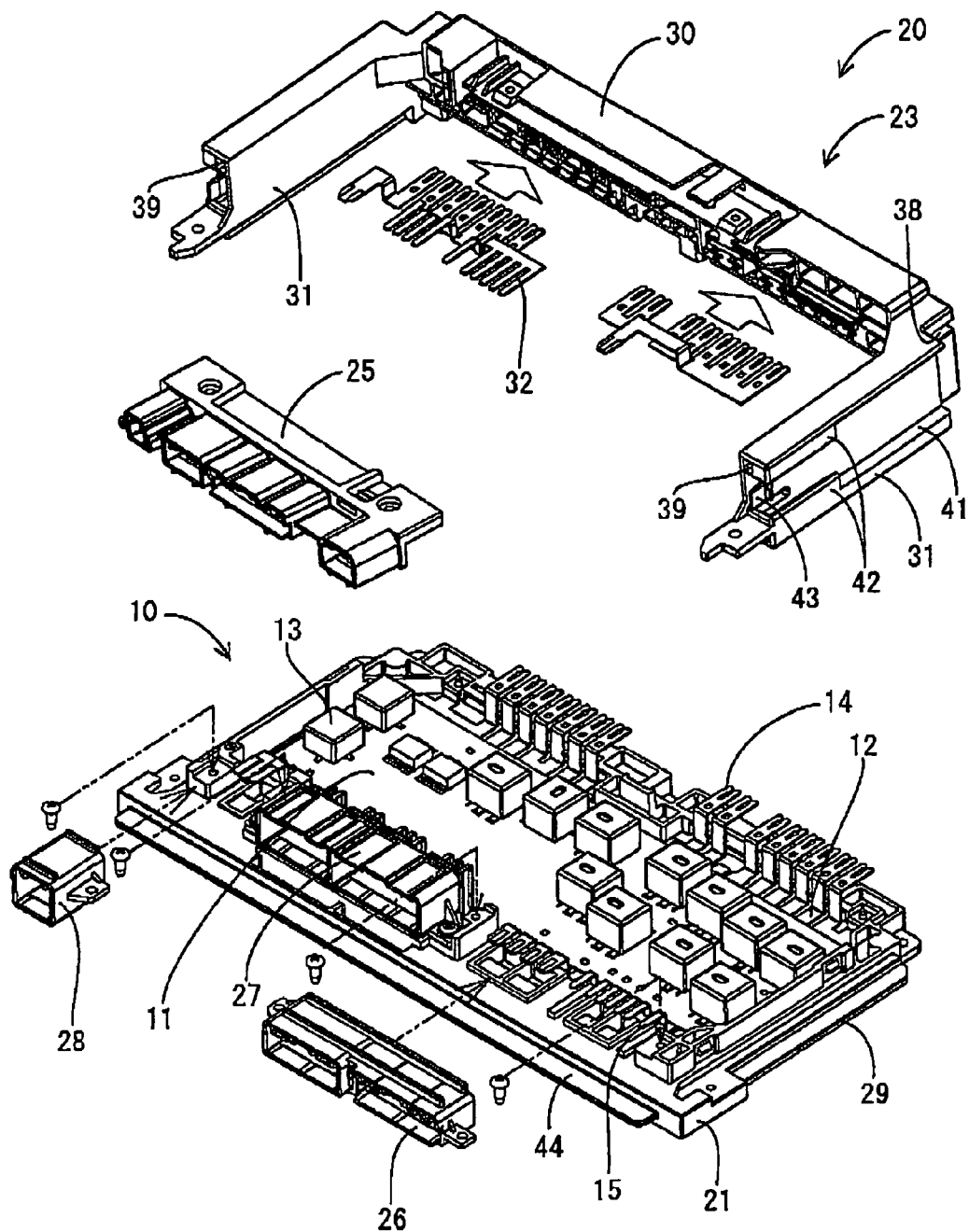
FIG. 2 is a perspective view showing an exploded state of the electrical connection box.
Figure 3:
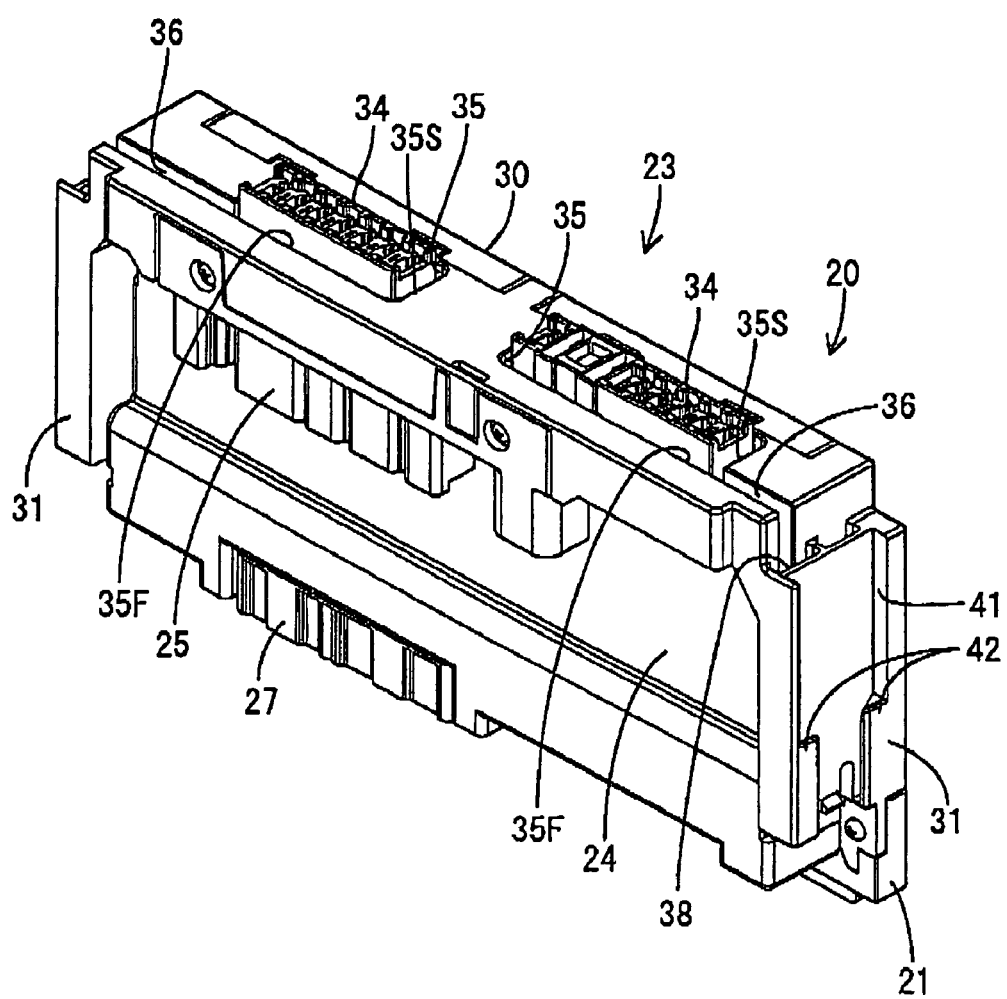
FIG. 3 is a perspective view showing the electrical connection box in an orientation in which it is mounted in an automobile.
Figure 4:
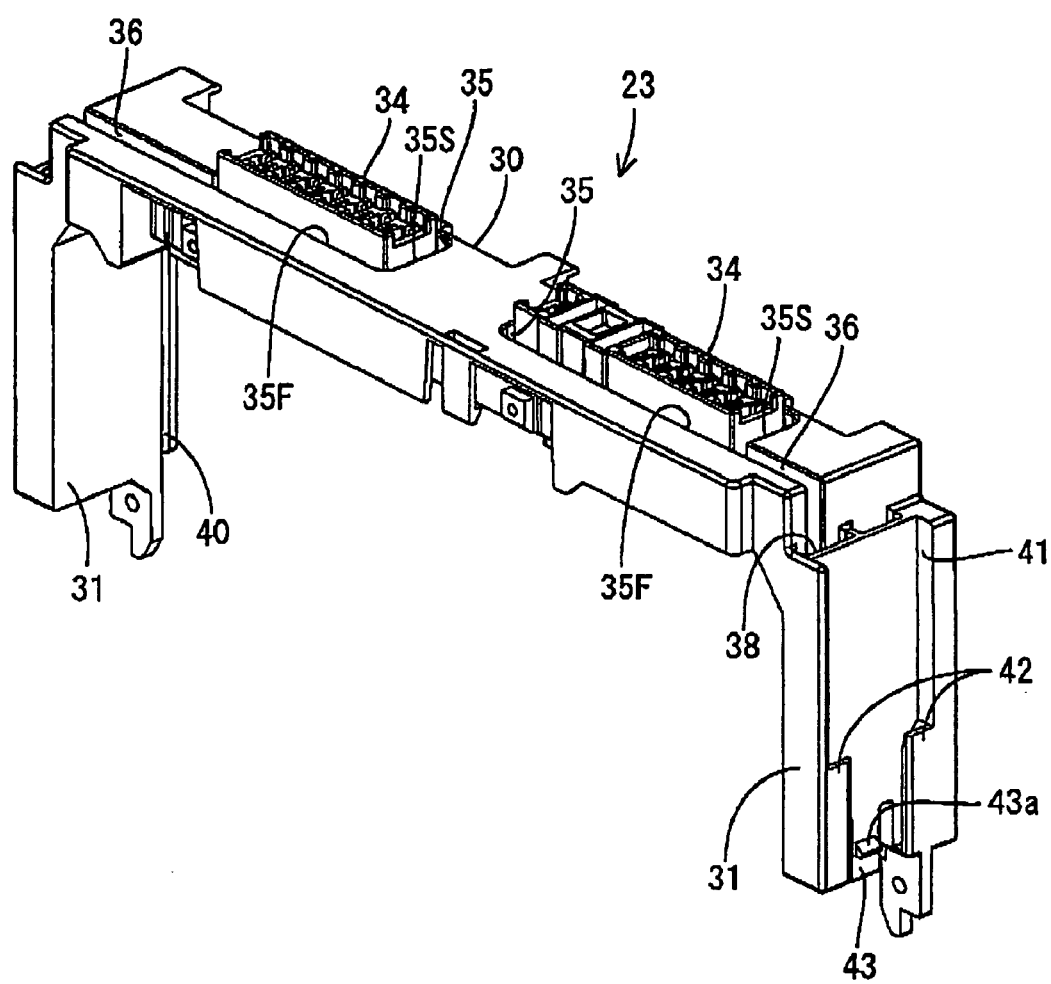
FIG. 4 is a perspective view of the fuse block.
Figure 5:
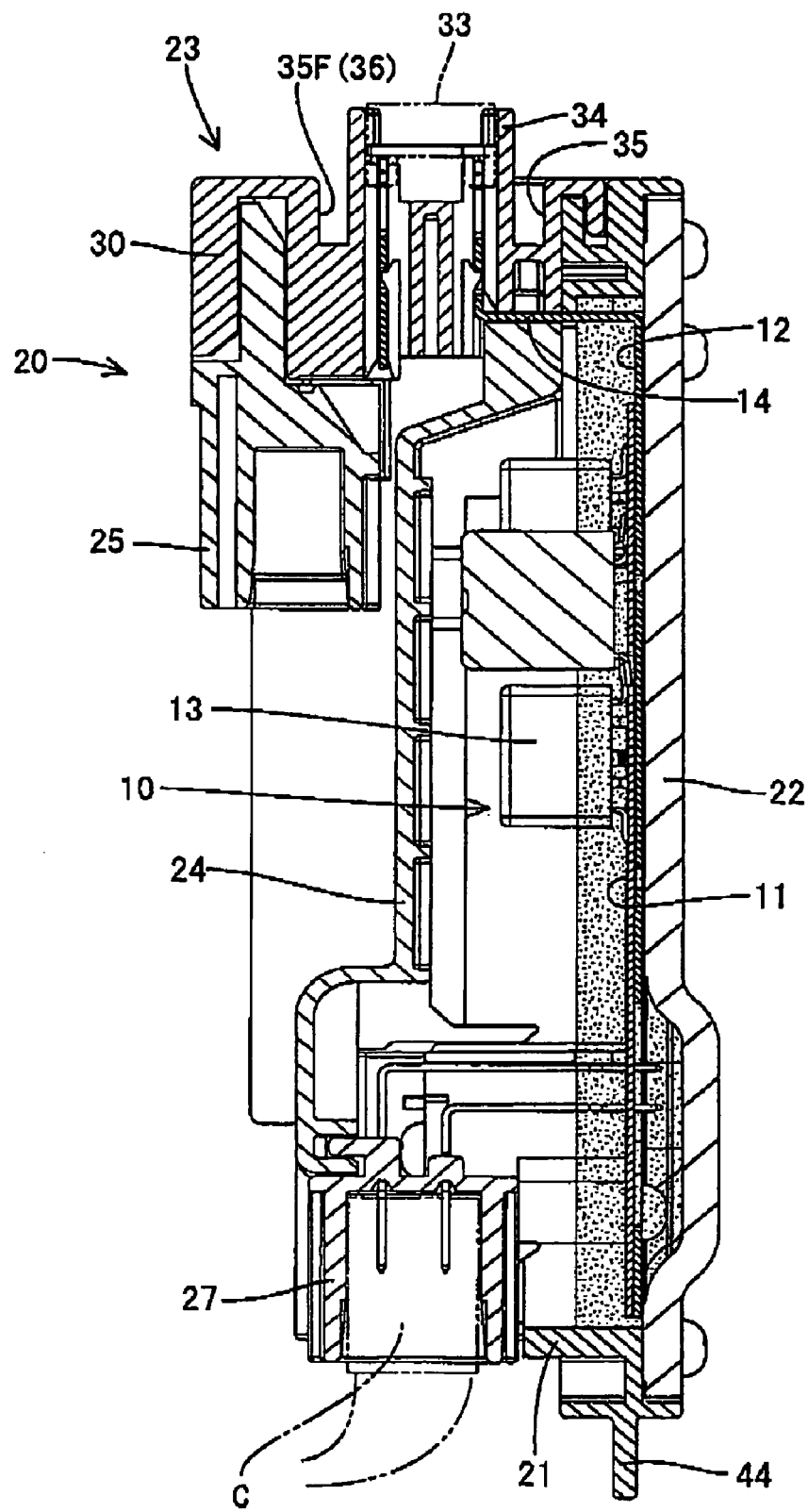
FIG. 5 is a sectional view of the electrical connection box.

Below, a first illustrative example, which embodies the present invention, will be explained with reference to FIG. 1 through FIG. 13. In the electric power distribution system of this illustrative example, the electrical connection box P is positioned on the housing H, mounted in an automobile, positioned between a battery (not illustrated) and electrical equipment such as lamps, audio, and the like (not illustrated). The electrical connection box P not only takes electric power supplied by the battery and distributes and supplies it to the electrical equipment, but also controls the switching and the like of the electric power that is supplied from the battery to each piece of equipment. In FIG. 1 and FIG. 2, the electrical connection box is drawn so that its obverse side faces upward, but in its mounted state in an automobile, as shown in FIG. 3 and FIG. 5, the electrical connection box is oriented such that a main body portion 30 of a fuse block 23 is positioned on the top side and arm portions 31 of the fuse block 23 extend downward. Hereinafter, the up-down and left-right orientations are explained using the installed state in an automobile, which is placed on a horizontal plane, as the reference.

The electrical connection box includes a circuit assembly 10 and a case 20 on which the circuit assembly 10 is positioned.

The circuit assembly 10 includes a circuit board 11 having a face that faces in a vertical direction, a plurality of bus bars 12 that are wired along the reverse face (the right face in FIG. 5) of the circuit board 11, and switching members 13, such as relays and the like, that are mounted on the obverse side (the left face in FIG. 5) of the circuit board 11. The bus bars 12 are bonded to the reverse face of the circuit board 11. First terminal portions 14 that are formed on the ends of the bus bars 12 project from the top end edge of the circuit board 11. In the same manner, second terminal portions 15 that are formed on the ends of the bus bars 12 project from the bottom end edge of the circuit board 11.

The case 20 includes a frame 21, a heat sink 22, a fuse block 23, a cover plate 24, a first housing 25, and second through fourth housings 26, 27, and 28. The frame 21 is made of an insulating material such as a synthetic resin or the like and is formed into a roughly rectangular frame shape. The heat sink 22 is made of metal and is fixed to the frame 21 such that it covers the opening on the reverse side of the frame 21. The fuse block 23 is made of a synthetic resin and is attached to the frame 21 on the top side thereof. The cover plate 24 is made of a synthetic resin and is attached to the frame 21 such that it covers the opening on the obverse side of the frame 21 (the opposite side from the heat sink 22). The first housing 25 is made of a synthetic resin and is attached to the fuse block 23. The second through fourth housings 26, 27, and 28 are made of a synthetic resin and are attached to the bottom edge portion of the frame 21.

The frame 21 is arranged so that it surrounds the entire perimeter of the circuit assembly 10 continuously along the outside perimeter of the circuit board 11, and is also fixed to the obverse face of the heat sink 22 by means of an adhesive (not illustrated). The plurality of first terminal portions 14 described above is arranged such that they are lined up side by side along the top edge portion of the frame 21. Rib-shaped rocking restricting portions 29 are formed on the outsides of both the left and right edge portions of the frame 21 and extend in continuous straight lines in the up-down direction (the direction parallel to the direction in which the fuse block 23 is attached to the frame 21 and parallel to the length direction of the side edge portions). The rocking restricting portions 29 are formed such that they extend from the top ends of the side edge portions to the vicinity of the bottom end portions. In addition, a fitting plate 44 that projects downward along the entire width area of the frame 21 is formed at the bottom edge portion of the frame 21. The heat sink 22 is roughly similar in shape to the circuit board 11, and the reverse faces of the bus bars 12 are bonded by an adhesive (not illustrated) to the obverse face of the heat sink 22.

The fuse block 23 includes the horizontally long and roughly block-shaped main body portion 30, which is arranged along the top edge portion of the frame 21, and a pair of arm portions 31, which are shaped like cantilevers and extend downward (downward in a perpendicular direction) from both the left and right ends of the main body portion 30.

The top ends of the first terminal portions 14, roughly the top halves of the terminal fittings 32, and fuses 33 that connect the first terminal portions 14 and the terminal fittings 32 are accommodated within the main body portion 30. Two parts accommodation portions 34, left and right, to accommodate fuses 33, are formed on the horizontal top side of the main body portion 30. The parts accommodation portions 34 are formed such that they project farther upward in a rectangular block shape than the top face of the main body portion 30, and provide a space for accommodating the fuses 33 at the top face side. Also on the top face of the main body portion 30, two first drainage grooves 35 are formed in the shape of rectangular frames that follow the outside perimeter face of each parts accommodation portion 34 and surround the entire perimeter of each parts accommodation portion 34. The two first drainage grooves 35 are disposed so as to be separated in the left-right directions (the length direction of the main body portion 30). The top end of the inside face (inside peripheral face) of the first drainage grooves 35 and the bottom end of the outside peripheral face of the parts accommodation portions 34 are vertically continuous so as to be flush along the entire perimeter at a height identical to the top face of the main body portion 30.

Two second drainage grooves 36 are also similarly formed on the top face of the main body portion 30, extending from the ends of front grooves 35F of the first drainage grooves 35 so as to extend the front grooves 35F in straight lines toward the arm portions 31 side (the outside face of the electrical connection box P). The extended end portions of the second drainage grooves 36 reach the outside face of the arm portions 31. The width of the second drainage grooves 36 is wider than the width of the front grooves 35F. Also, the front inside face of the front grooves 35F and the front inside face of the second drainage grooves 36 are continuously flush. A pair of drainage channels formed by first drainage grooves 35 and the second drainage grooves 36 are disposed at an interval in the length direction (the left-right direction) of the top face of the main body portion 30, and extend in mutually opposing directions to reach the arm portions 31 (the outside face of the electrical connection box P).

Figure 6:
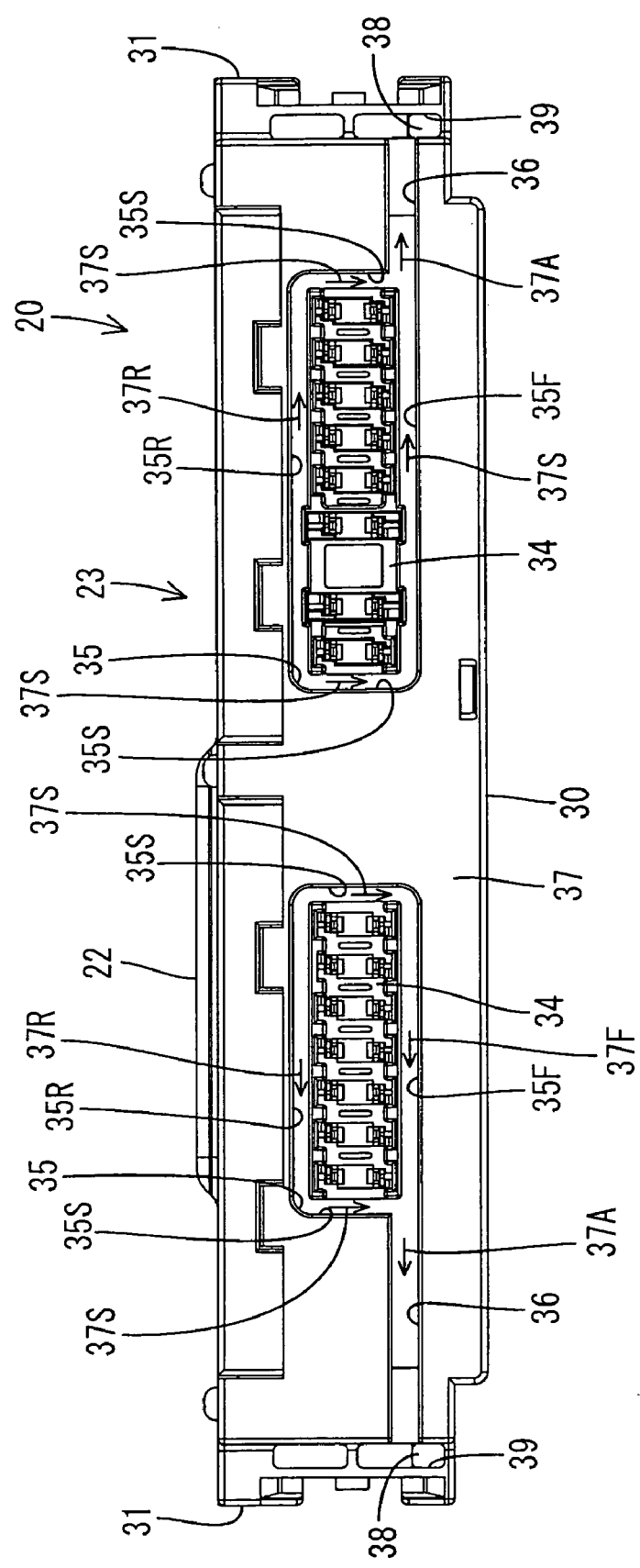
FIG. 6 is a plan view of the electrical connection box.
Figure 7:
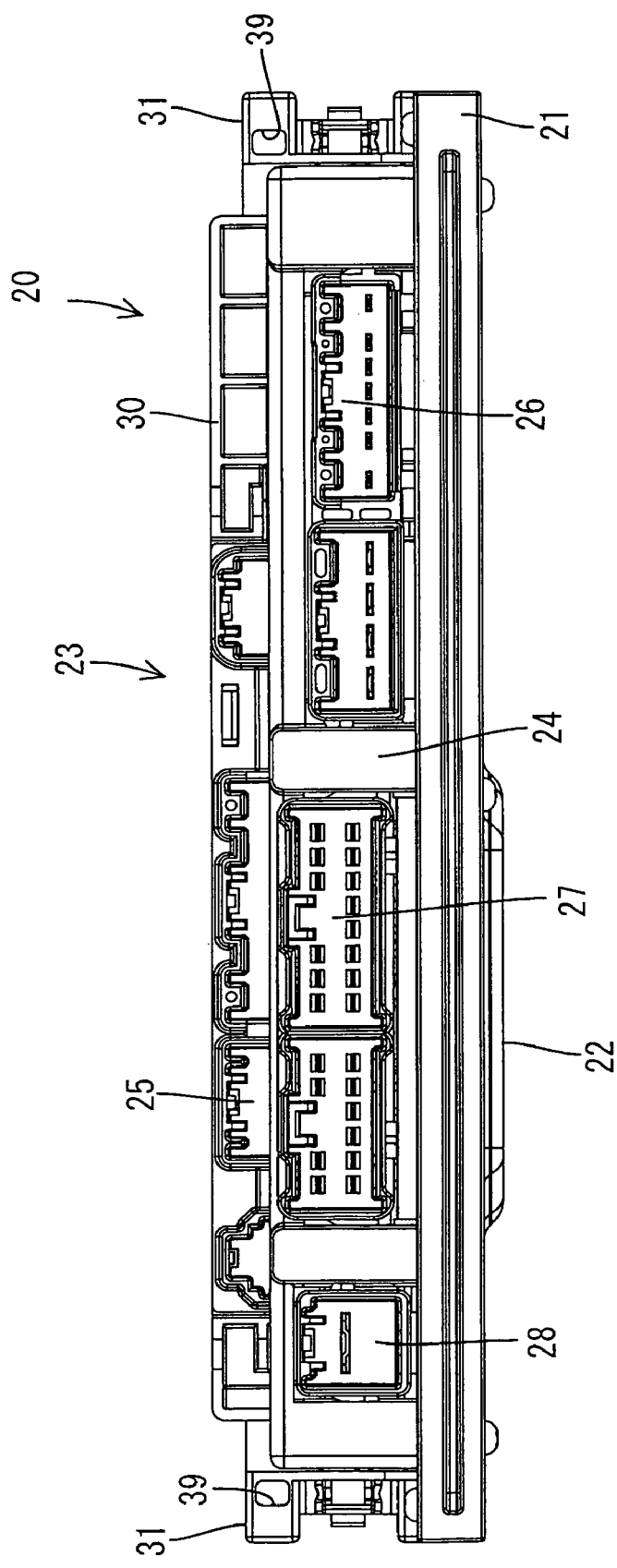
FIG. 7 is a bottom view of the electrical connection box.
Figure 8:
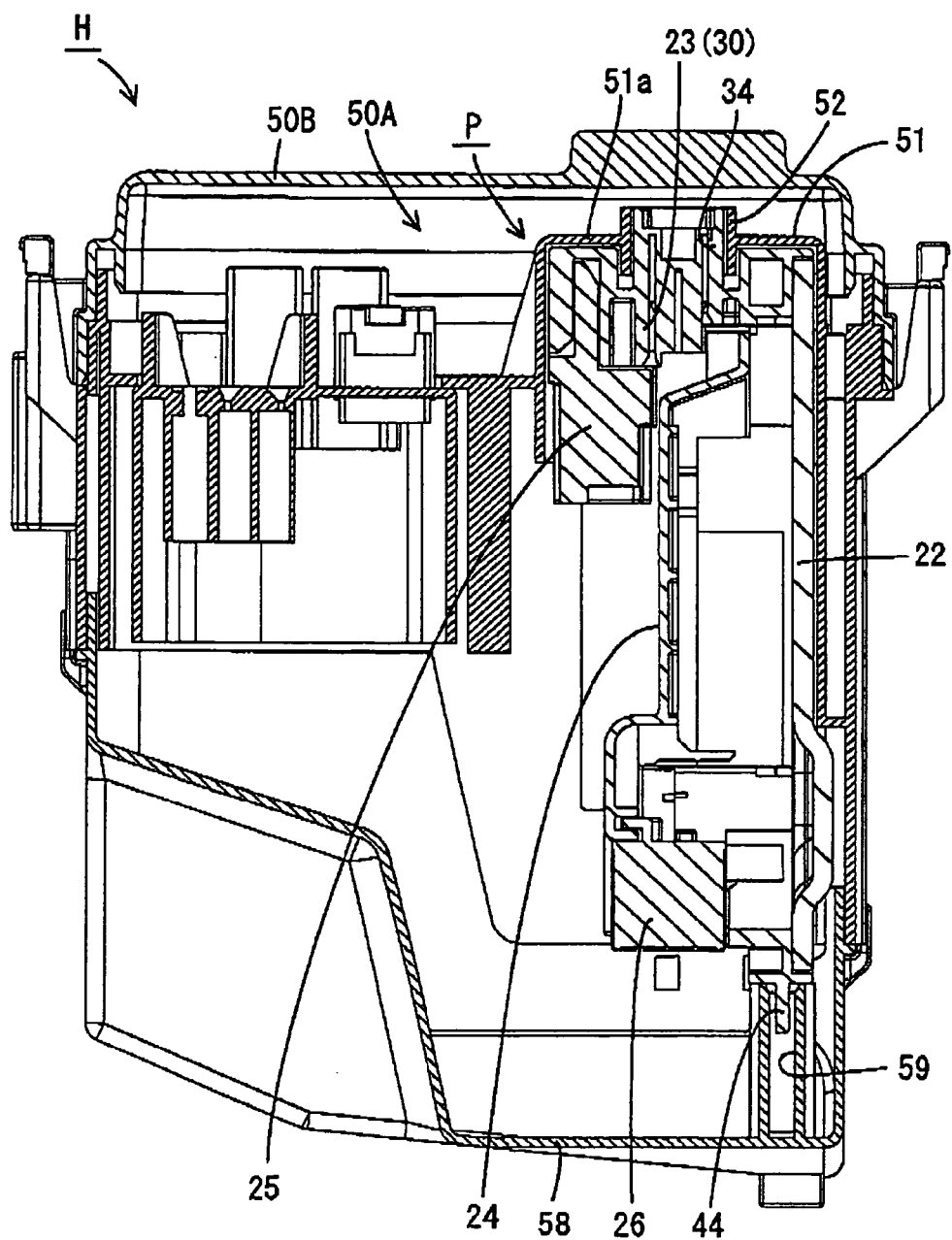
FIG. 8 is a sectional view showing the state of attachment between the electrical connection box and the cover.
Figure 9:
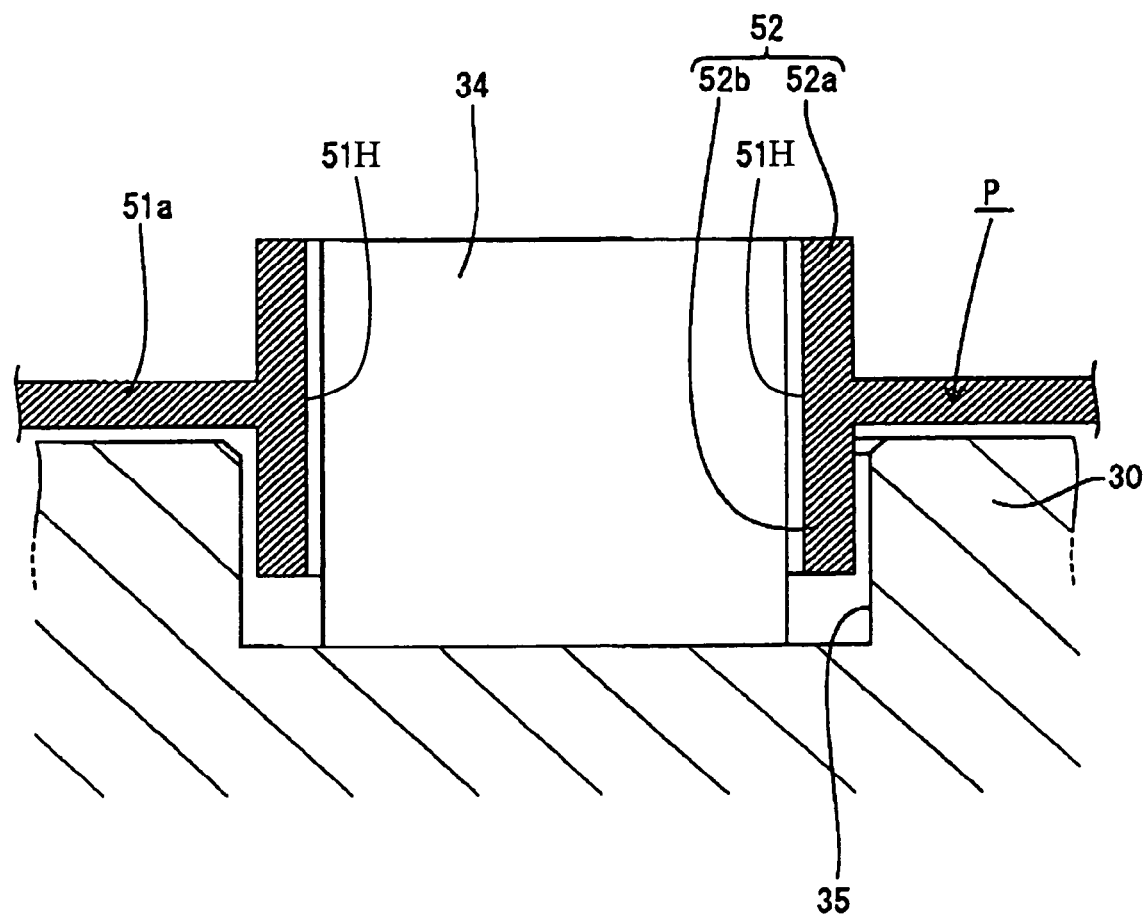
FIG. 9 is an enlarged sectional view showing the shapes of the opening portion of the support member that forms the cover, the parts accommodation portions, and the drainage grooves.
Figure 10:
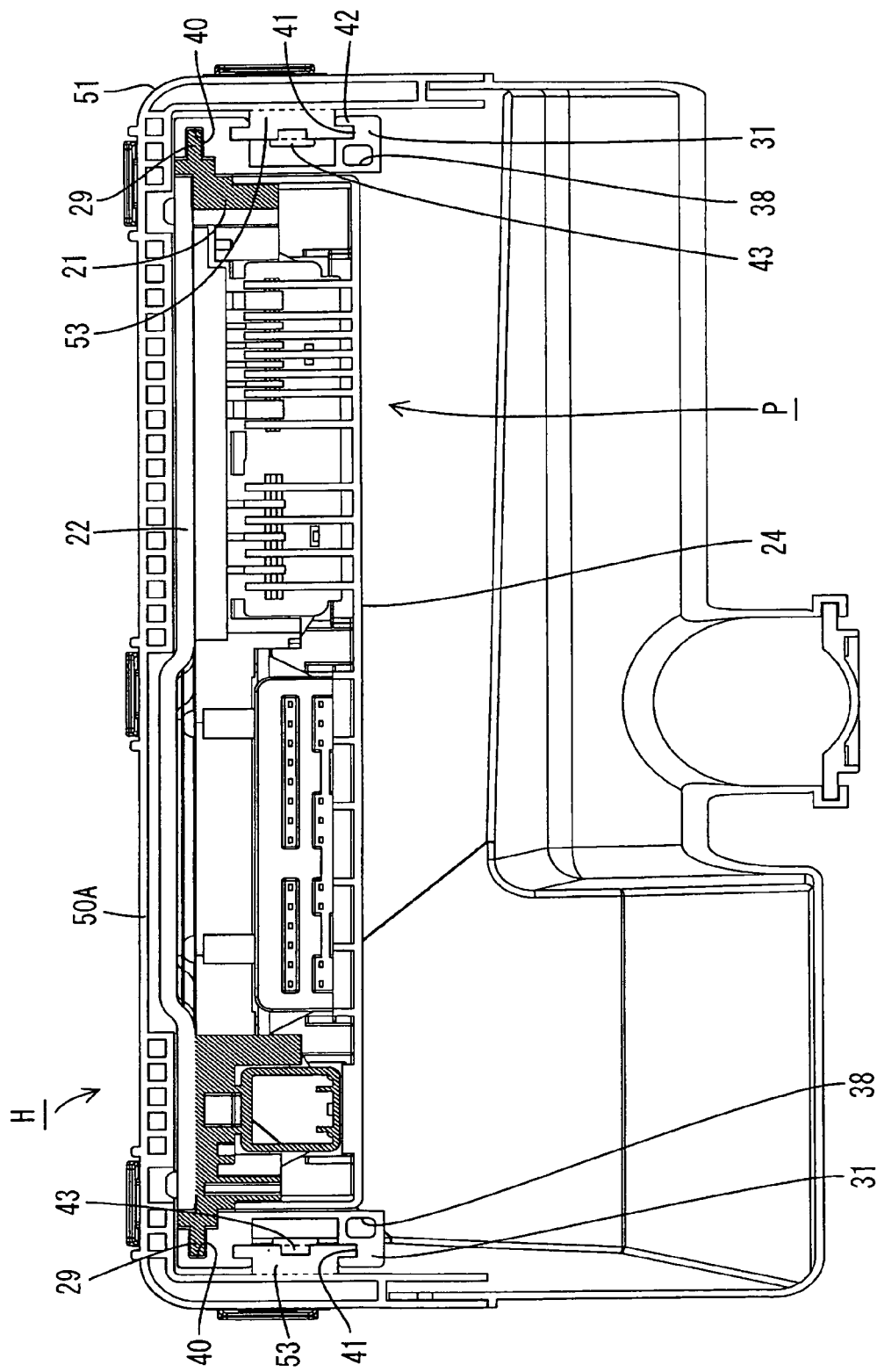
FIG. 10 is a horizontal sectional view of the state of attachment between the electrical connection box and cover viewed from the bottom face side.
Figure 11:
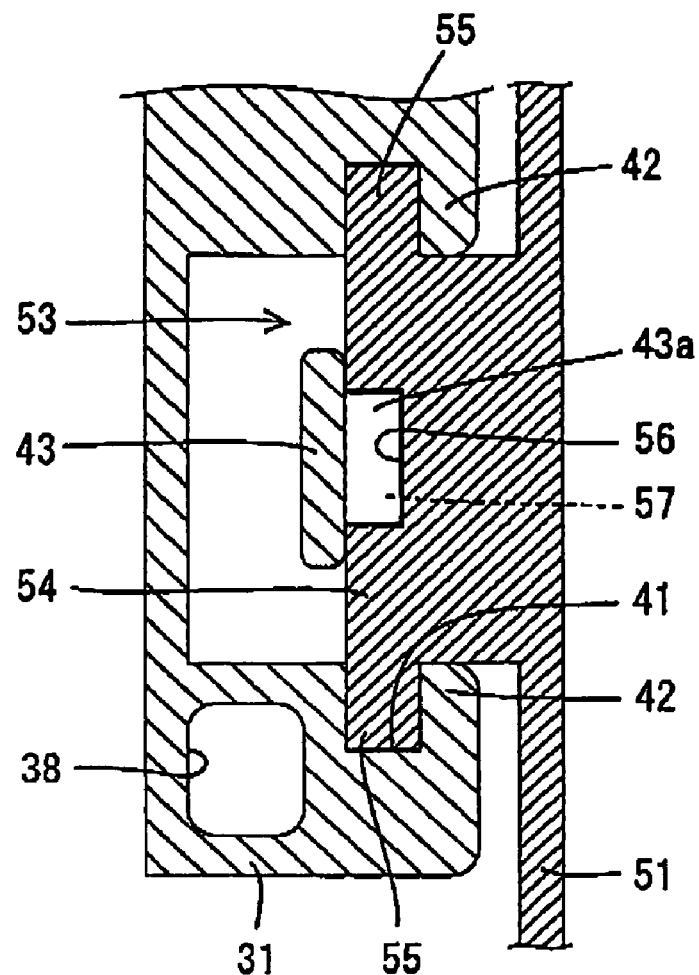
FIG. 11 is a partial enlarged horizontal sectional view showing the fitted state of the tilting restricting portion.
Figure 12:
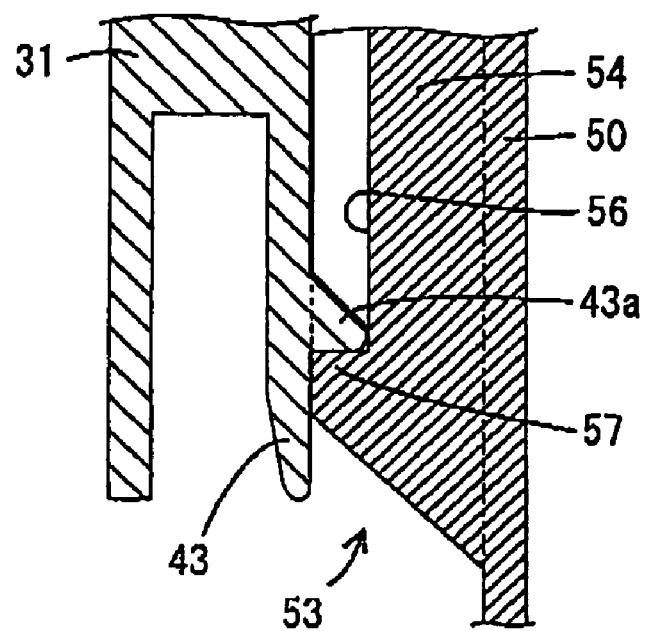
FIG. 12 is a partial enlarged vertical sectional view showing the state of engagement between the support member and the electrical connection box.
Figure 13:
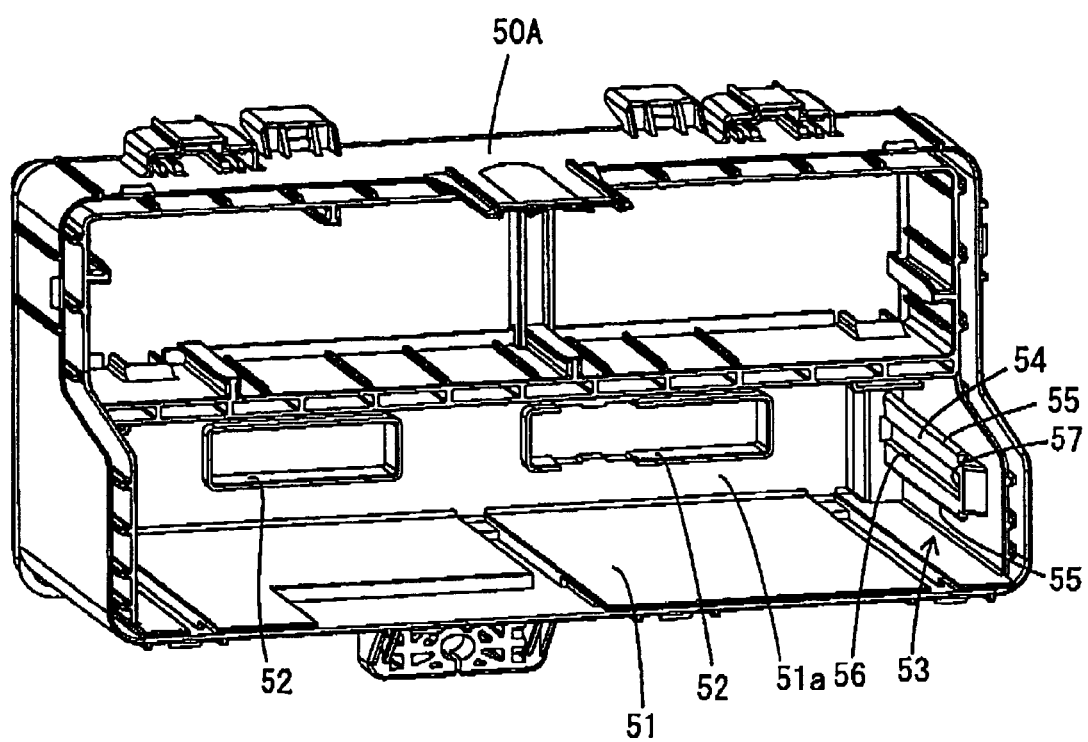
FIG. 13 is a perspective view of the support member viewed from below.

In addition, as shown in FIG. 6, an inclined face 37 that inclines with respect to the horizontal plane is formed on the bottom faces of the first drainage grooves 35 and the second drainage grooves 36. The inclined face 37 inclines overall such that liquids will flow through the first drainage grooves 35 and the second drainage grooves 36 towards drainage channels 38 explained below. Specifically, on the front groove 35F and the rear groove 35R of the first drainage grooves 35, inclined faces 37F and 37R are formed over the entire length thereof so as to establish a downward slope (that is, inclined with respect to the horizontal plane) from the center of the main body portion 30 in the width direction towards the outside direction (the arm portions 31). In addition, in both the left and right side portions 35S of the first drainage grooves 35, inclined faces 37S are formed over the entire length thereof so as to establish a downward slope (that is, inclined with respect to the horizontal plane) from the rear drainage grooves 35R towards front groove 35F side. Furthermore, on the second drainage grooves 36, inclined faces 37A are formed over the entire length thereof so as to establish a downward slope (that is, inclined with respect to the horizontal plane) from the first drainage grooves 35 toward the drainage channels 38 (the arm portions 31). Water that is retained in the first drainage grooves 35 and the second drainage grooves 36 flows in the direction of the arrow in FIG. 6 along the slope of the inclined faces 37A, F, R and S to arrive at the drainage channels 38. Note that the inclination angle of each of the inclined faces 37A, F, R, and S is a constant angle from the topmost end of the inclined faces to the bottommost end, but the inclination angles of the inclined faces 37A, F, R, and S may differ in portions from the topmost end to the bottommost end of the inclined faces. In addition, between the inclined faces 37A, F, R, and S, the inclination angles may be the same angle or the inclination angles may be different from each other.

The drainage channels 38 that extend in the up-down direction (the direction parallel to the direction of extension of the arm portions 31) are formed on the outside face of each arm portion 31. The drainage channels 38 extend from the top end to the bottom end of the arm portion 31. The greater part of the drainage channels 38, with the exception of its top end, forms through-holes in the up-down direction that is enclosed on the front, back, left, and right. The top ends of the drainage channels 38 are continuous with the ends of the second drainage grooves 36. The bottom ends of the drainage channels 38 are open to form drainage outlets 39. In addition, groove-shaped rocking restricting portions 40 (refer to FIG. 4) that extend in straight lines in the up-down direction are formed on the inside faces of the arm portions 31 (the faces that face the side edge portions of the frame 21).

Similarly, tilting restricting portions 41 that form a pair of grooves on the left and right are formed on the outside face of the arm portions 31. These tilting restricting portions 41 are formed from the top end to the bottom end of the arm portions 31, and are formed to extend in straight lines in the up-down direction (the direction identical to the insertion direction of the electrical connection box P in relation to the housing H). In addition, a pair of pressing ribs 42 that extends from the opening edge thereof inward is formed in roughly the bottom halves of the tilting restricting portions 41. Furthermore, on the bottom end portion of the tilting restricting portions 41, elastic engaging pieces 43 are formed so as to extend downward in a cantilever shape. Engagement projections 43a are formed on the outside face of the elastic engaging pieces 43.

The fuse block 23 is attached to the frame 21 by moving it toward the frame 21 from above. In the attachment process, both arm portions 31 slide on the outside faces of both the left and right side edge portions of the frame 21. (The arm portions 31 sandwich the frame 21 from the left and right.) This process positions the fuse block 23 in the left-right direction on the frame 21. The process also causes the rocking restricting portions 29 and 40 of the frame 21 and the fuse block 23 to engage with one another. This restricts the diagonal displacement (tilting) of the arm portions 31 in relation to the side edge portions of the frame 21 in the front-back direction, which is orthogonal to the length direction. It also positions the fuse block 23 in relation to the frame 21 in the front-back direction. In addition, the engagement of the rocking restricting portions 29 and 40 also guides the fuse block 23 to its prescribed attachment position in relation to the frame 21. When the fuse block 23 reaches the proper attachment position, the fuse block 23 and the frame 21 are held in an attached state if the bottom end portions of the arm portions 31 are affixed to the frame 21 by screws.

In the attached state, the drain outlets 39 of the bottom ends of the drainage channels 38 open downward in the bottom end portion of the frame 21 (case 20).

The first housing 25 is attached to the main body portion 30 of the fuse block 23 from below. Roughly the bottom halves of the terminal fittings 32 are positioned within the first housing 25. The fitting tube portions of the first housing 25 are open facing downward. The second through fourth housings 26, 27, and 28 are secured by screws to the obverse face (front face) of the bottom edge portion of the frame 21 and have fitting tube portions that are open facing downward. Wiring harness connectors C are fitted into the fitting tube portions of the first through fourth housings 25, 26, 27, and 28. The cover plate 24 has an overall shape that is almost the same as that of the circuit board 11, but it is larger than the circuit board 11 in both length and width. The cover plate 24 is attached to the frame 21 from the front side. In its attached state, the cover plate 24 covers and conceals the circuit board 11 and the switching members 13 that are positioned within the frame 21.

The housing H includes a cover 50A and an upper lid SOB with an opened bottom face installed so as to cover the top face of the cover 50A. The cover 50A includes a supporting member 51 with an opened bottom face and a bottom lid 58 that is attached so as to cover the opening in the bottom face of this support member 51.

A horizontal plate portion 51a that is aligned with the electrical connection box P is formed on the support member 51. A pair of left and right opening portions 51H are formed on the plate portion 51a in order to expose the parts accommodation portions 34, and an angled tube shaped guiding portion 52b that extends downward (inside the first drainage grooves 35) are formed from the opening edge of each opening portion 51H along the entire perimeter, and an angled tube shaped water barrier wall 52a is formed that extends flush with the guiding portion 52b downward (the opposite side from the guiding portion 52b) from the opening edge of each opening portion 51H along the entire perimeter. The water barrier wall 52a and guiding portion 52b serve as a roughly square tube-shaped tubular fitting portion 52 (a positioning portion of the present invention) that passes in an up-down direction through the plate portion 51a.

In addition, a pair of left and right tilting restricting portions 53 that extend in the up-down direction are formed on the inside face of the supporting member 51. The tilting restricting portions 53 include a supporting block portion 54 that projects in a long and narrow block shape from the inside face of the supporting member 51 and a pair of restricting ribs 55 that project in the front-back direction from both the front and back edge portions of this supporting block portion 54, and a leak-off groove 56 is formed in the up-down direction on the inside face of the support block portion 54. The formation area of the leak-off groove 56 extends from the top end of the supporting block portion 54 to a position slightly above the bottom end, and an engaging portion 57 is formed on the bottom end portion of the leak-off groove 56. Such a tilting restricting portion 53 is formed so as to extend from a position in proximity to the bottom end face opening of the support member to the top end portion of the plate portion 51a. A fitting groove 59, which opens upward and is elongated in the left-right direction, is formed on the outer perimeter edge portion of the bottom lid 58.

When the electrical connection box P is accommodated inside the housing H, first the bottom lid 58 is removed from the supporting member 51, the electrical connection box P is inserted from the opening in the bottom face of the supporting member 51, and the top end portion of the tilting restricting portion 41 of the fuse block 23 is fit onto the bottom end portion of the tilting restricting portion 53. By fitting the tilting restricting portions 41 and 53 together, the tilting (relative displacement) of the electrical connection box P in the front-back direction in relation to the supporting member 51 is restricted. When the insertion of the electrical connection box P progresses from this state, due to the engagement between the tilting restricting portions 41 and 53, the electrical connection box P is guided so as to move to prescribed position and along a prescribed insertion path in relation to the supporting member 51. In addition, during the approximately last half of the insertion operation, the pressing ribs 42 engage on the restricting ribs 55, and thereby the tilting (relative displacement) of the arm portions 31 (the electrical connection box P) in the left-right direction in relation to the supporting member 51 is restricted.

Then when the electrical connection box P reaches the normal attachment position, the parts accommodation portions 34 on the top end face of the fuse block 23 is fit into the tubular fitting portion 52 of the supporting member 51, and thereby the relative displacement of the electrical connection box P in the front, back, left, and right directions in relation to the supporting member 51 (the direction orthogonal to the insertion direction of the electrical connection box P in relation to the supporting member 51) is restricted. In addition, simultaneously, because the engaging projections 43a of the elastic engaging pieces 43 are engaged from above to the engaging portions 57, the electrical connection box P is restricted from falling downward (coming out of the supporting member 51) in relation to the supporting member 51, and except for the bottom end portion of the electrical connection box P, the electrical connection box P is positioned inside the supporting member 51.

Subsequently, when the bottom lid 58 is attached to the opening at the bottom face of the supporting member 51, the cover 50A is formed, and except for the top face of the parts accommodation portion 34 that is exposed above from the tubular fitting portion 52 (that is, the openings for attaching and detaching the fuses 33), almost the entire electrical connection box P is positioned inside the cover 50A. In addition, accompanying the attachment of the bottom lid 58, the fitting plate 44 on the bottom face of the electrical connection box P and the fitting groove 59 of the bottom lid 58 are fit together. Finally, when the upper lid 50B is attached so as to cover the top face (the opening on the top faces of the parts accommodation portions 34) of the cover 50A, the housing H is complete, the accommodation step of the electrical connection box P in the housing H is finished, and the electric power distribution system is complete.

In the state in which the electrical connection box P is positioned in the cover 50A, the top faces of the parts accommodation portions 34 are positioned a little above the plate portion 51a, but the outside peripheral face of these parts accommodation portions 34 is surrounded by the water barrier wall 52a. In addition, the top end of the water barrier wall 52a is positioned at a height that is substantially identical to that of the top end of the parts accommodation portion 34. In addition, the water barrier wall 52a and the guiding portion 52b are enclosed so as to face each other, and only a small interval is established in relation to the outside peripheral face of the parts accommodation portions 34. Furthermore, the guiding portion 52b projects towards the inside of the first drainage groove 35.

In this illustrative example, while the electrical connection box P is accommodated in the cover 50A, the parts accommodation portions 34 are exposed to the outside at the opening portion 51H (the tubular fitting portion 52) on the top face of the cover 50A, and thus there is a concern that water that adheres to the top face of this cover 50A will penetrate the top face of the case 20 of the electrical connection box P (the main body portion 30 of the fuse block 56) through the gap between the opening portion 51H of the cover 50A and the parts accommodation portion 34.

However, in this illustrative example, the drainage grooves 35 and 36 are formed on the top face of the case 20 so as to extend to the drainage channels 38 on the outside face of the case 20, and the inclined faces 37 that establish a downward slope towards the drainage channels 38 are formed on the bottom face of the drainage grooves 35 and 36. Thus, water that remains on the top face of the case 20 (main body portion 30) can be reliably drained by flowing into the drainage grooves 35 and 36 then flowing along the inclined faces 37.

In particular, in this illustrative example, the drainage grooves 35 and 36 are provided as a pair of separate left and right drainage channels having a gap therebetween in the length direction of the top face of the electrical connection box P. Thus, in comparison to a structure in which one drainage groove is formed substantially along the entire length of the top face of the electrical connection box, the maximum length of the drainage grooves extending to the drainage channels 38 becomes short. Therefore, the water drainage capacity is superior.

In addition, because the outside peripheral face of the parts accommodation portions 34 and the inside peripheral face of the first drainage grooves 35 that surround the parts accommodation portions 34 are joined flush to each other, the water adhering to the outside peripheral face of the parts accommodation portions 34 is reliably guided into the first drainage grooves 35 without attaching to the top face of the main body portion 30.

Furthermore, in this illustrative example, the parts accommodation portions 34 are formed so as to project upward from the top face of the cover 50A, but because the water barrier wall 52a that rises from the opening edge of the opening portion 51H that exposes these parts accommodation portions 34 is formed on the cover 50A, water that remains on the top face of the cover 50A (the plate portion 51a of the supporting member 51) can be prevented from adhering to the top face and the outside peripheral face of the parts accommodation portions 34.

Furthermore, in this illustrative example, a guiding portion 52b is formed that extends downward from the opening edge of the opening portion 51H towards the inside of the first drainage grooves 35, and thus, even in the case in which water adheres to the inside peripheral face of the water barrier wall 52a, this water can be reliably guided into the first drainage grooves 35 by flowing from the water barrier wall 52a along the inside peripheral face of the guiding portion 52b.

In addition, because the water that flows into the drainage grooves 35 and 36 is drained by a path from the top face of the case 20 (the fuse block 23) through the drainage channels 38 to the bottom end portion of the case 20, even if the outside face of the case 20 and the electrical contact portion are disposed on the front face, shorting does not occur at this electrical contact portion. Furthermore, because the drainage channels 38 have the form of a through-hole, even when the electrical connection box is vibrated, there is no concern that water will leak outside the drainage channels 38.

In addition, the case 20 is provided with a frame 21 and a fuse block 23. This frame 21 has a face that faces in a vertical direction and is disposed along the peripheral edge portion of the circuit board 11, and the fuse block 23 is formed such that the arm portions 31 are extended downward from the main body portion 30 that is disposed along the top edge portion of the frame 21 so as to align with the side edge portion of the frame 21. However, in the illustrative example, the shape of this fuse block 23 is used and the drainage grooves 35 and 36 are formed on the main body portion 30 of the fuse block 23 and drainage channels 38 are formed on the arm portions 31. Furthermore, by engaging the rocking restricting portions 40 of the arm portions 31 with the rocking restricting portions 29 of the side edge portion of the frame 21, the fuse block 23 is restricted from tilting in the front-back direction in relation to the frame 21 because the main body portion 30 acts as a fulcrum. In this manner, in this illustrative example, because the arm portions 31, which are structures that form the drainage channels 38, also serve as the tilting restricting means of the fuse block 23, the shape of the fuse block 23 is thereby made simpler than a structure in which the tilting restricting means of the fuse block 23 are formed separately from the arm portions 31.

In this illustrative example, positioning portions (the parts accommodation portions 34 and the tubular fitting portion 52) that restrict movement of the electrical connection box P in the front, back, left, and right directions in the holding member 50A are provided by engaging the top end edge portion of the electrical connection box P and the holding member 50A of the housing H together. However, tilting restricting portions 41 and 53 are provided on the supporting member 51 of the holding member 50A and the electrical connection box P. These tilting restricting portions 41 and 53 are disposed at a position separated downward from the positioning portions and enable restricting the electrical connection box P from tilting by being fit together, where the fitting portion of the positioning portions (the parts accommodation portions 34 and the tubular fitting portions 52) acts substantially as a fulcrum. In this manner, because the electrical connection box P, which has been inserted in the supporting member 51, is engaged by the supporting member 51 at the mutually separated positioning portions (the parts accommodation portions 34 and the tubular fitting portion 52) and the tilting restricting portion 41 and 53, it is possible to prevent the electrical connection box P from tilting in the front-back direction, where the portion that fits the positioning portions (the parts accommodation portion 34 and the tubular fitting portion 52) acts substantially as a fulcrum.

In addition, because the tilting restricting portions 41 and 53 are formed to extend along the insertion direction of the electrical connection box P in relation to the supporting member 51, the tilting restricting portions 41 and 53 are fit together when the electrical connection box P is inserted into the supporting member 51. Thereby, the electrical connection box P is guided along a prescribed insertion path in relation to the supporting member 51, and the positioning portions of the electrical connection box P and the supporting member 51 (the parts accommodation portions 32 and the tubular fitting portion 52) can be reliably engaged.

In addition, because the tilting restricting portion 53 of the supporting member 51 is disposed in proximity to the opening of the supporting member 51, during the process of inserting the electrical connection box P into the supporting member 51, it is possible to confirm visually the fitting state of the tilting restricting portions 41 and 53.

In addition, in the case in which the positioning portions and the tilting restricting portions that differ from this illustrative example are formed by different members, the positioning portions and the tilting restricting portions may be misaligned because of the attachment tolerances of both members, and as a result, there is a concern that when the electrical connection box P is inserted into the supporting member 51, the positioning members will not be able to engage together smoothly. However, in this illustrative example, because the positioning portion (the parts accommodation portion 34) on the electrical connection box P side and the tilting restricting portion 41 are formed in one part (the fuse block 23), there is no concern that the engagement between the positioning portions (the parts accommodation portion 34 and the tubular fitting portion 52) will be hindered because of the attachment tolerances between members.

Illustrative Example 2

Figure 14:
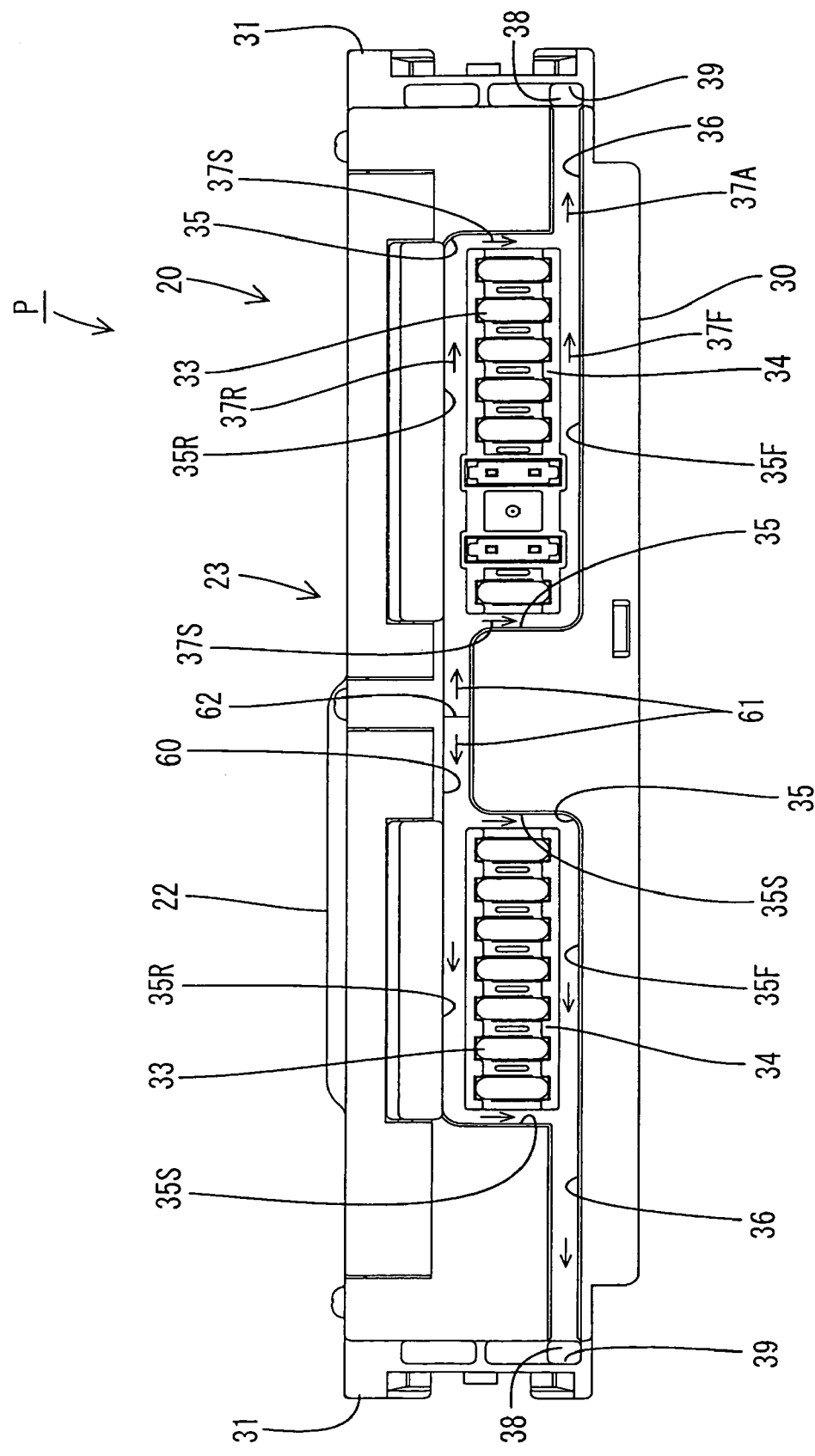
FIG. 14 is a plan view of the electrical connection box in a second illustrative example.

Next, the second illustrative example, which embodies the present invention, will be explained with reference to FIG. 14. The electrical connection box P of the second illustrative example forms a communicating groove 60 on the top face of the main body portion 30 of the fuse block 23 of the electrical connection box P in the first illustrative example. Because the other components are identical to those of the first illustrative example, identical reference numerals are used to denote the identical components, and the explanations of the structures, the operations, and the effects are omitted.

The communication groove 60 is formed so as to enable the pair of left and right first drainage grooves 35 to communicate with each other, and the communication groove 60 is formed so as to extend from the end portion of the rear groove 35R of each of the first drainage grooves 35 such that the rear groove 35R is extended in a straight line towards the side opposite to the arm portions 31 (the center side in the width direction). The back inside face of the communication groove 60 and the back inside face of the rear grooves 35R are connected so as to be flush. In addition, the width of the communication groove 60 has substantially the same dimension as the width of the rear grooves 35R, and the width is narrower than the gap from the front inside face of the front grooves 35F to the back inside face of the rear grooves 35R. On the bottom face of this communication groove 60, inclined faces 61 are formed that are inclined with respect to the horizontal plane that is identical to that of the inclined faces 37, which are formed on the bottom face of the first drainage grooves 35 and the second drainage grooves 36. These inclined faces 61 are slightly inclined so as to establish a downward slope towards the left-right direction (the arm portions 31 side), where the approximate center positions of both the left and right first drainage grooves 35 serves as the ridge line 62 in the width direction (the length direction of the main body portion 30). That is, the pair of left and right inclined faces 62 forms a continuous hill shape at the end portion (ridge line 62) at one end thereof. The other ends of the pair of left and right inclined faces 61 are connected smoothly and flush with each other in relation to the inclined faces 37R of the rear groove 35R. Note that the inclination angle of the inclined faces 37R of the rear groove 35R and the inclination angle of the inclined faces 61 of the communication groove 60 may be identical angles or may be different angles.

Because the electrical connection box P is mounted on an automobile, there are cases in which the electrical connection box P tilts at an angle that is larger than the slope of the inclined faces 37 of the drainage grooves 35 and 36 because of the tilting of the vehicle body caused by the slope of the road face while the automobile is stopped, the rolling during driving, pitching, nose diving and the like. When such a case occurs, there is a concern that water in the first drainage grooves 35 among the two left and right first drainage grooves 35 that is positioned on the higher side (the top side of the inclination) may remain at the end portion on the side opposite to the outside face (arm portions 31) of the main body portion 30 in this first drainage groove 35. However, in the second illustrative example, because the pair of first drainage grooves 35 communicates by the communication groove 60, the water in the first drainage groove 35 positioned on the upper side of the inclination flows into the first drainage groove 35 positioned on the lower side of the inclination, and thereby the water is reliably drained to the outside face of the main body portion 30.

In addition, the inclined faces 62 of the communication groove 60 are inclined so as to establish a downward slope towards both sides, where the center position (the approximate center position in the width direction on the top face of the main body portion 30) of both first drainage grooves 35 serves as a ridge line 62. Because the pair of drainage grooves 35 and 36 are provided separated in both directions with the ridge line 62 interposed therebetween, the water that flows into the communication groove 60 does not stagnate in the communication groove 60, and reliably flows into the drainage grooves 35 and 36 to drain outside the main body portion 30.

Illustrative Example 3

Figure 15:
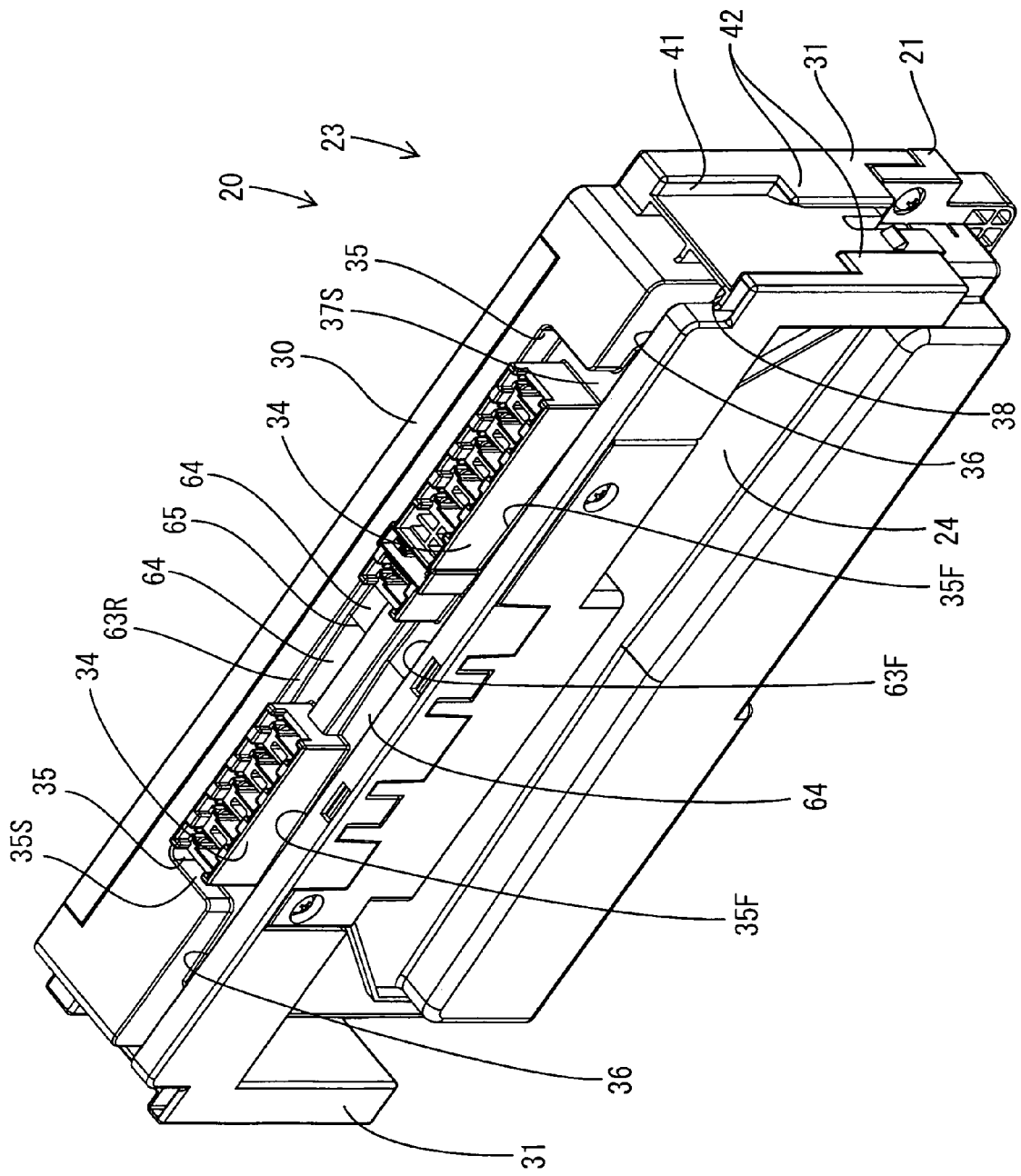
FIG. 15 is a perspective view of the electrical connection box in a third illustrative example.
Figure 16:
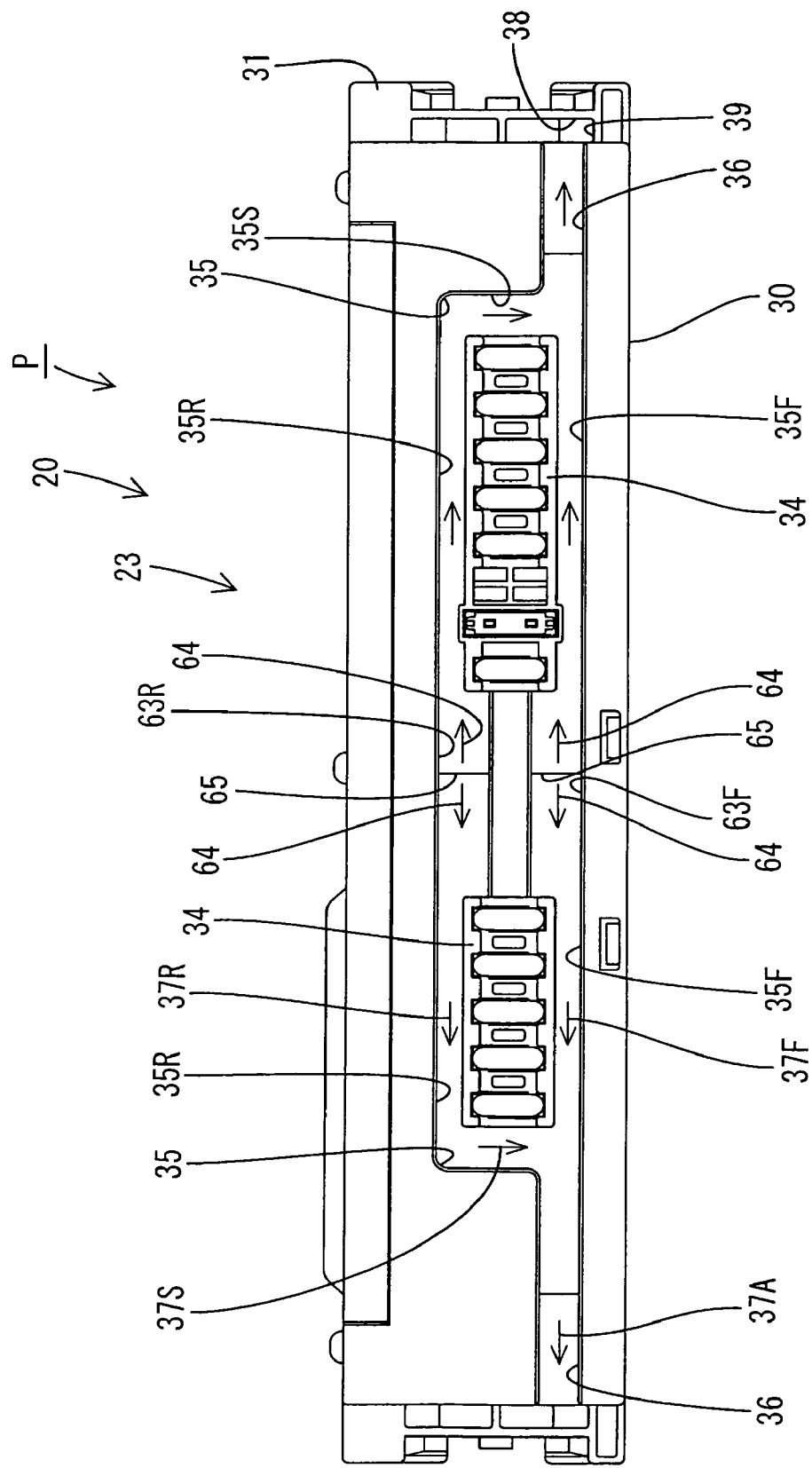
FIG. 16 is a plan view of the electrical connection box.

Next, a third illustrative example, which embodies the present invention, will be explained with reference to FIG. 15 and FIG. 16. The electrical connection box P of the third illustrative example is provided with, in the second illustrative example, a pair of front and rear communication grooves 63F and 63R, which are substantially parallel to each other, with an interval therebetween in the front-back direction orthogonal to the direction of separation (the left-right direction) between the pair of drainage grooves 35. The width dimension of these communication grooves 63F and 63R is larger than that of the front grooves 35F and the rear grooves 35R, and the front inside face of the front communication groove 63F is continuously flush with the front inside face of the front grooves 35F and the back inside face of the rear communication groove 63R is continuously flush with the back inside face of the rear grooves 35R. Specifically, the front inside face of the front communication groove 63F, the front inside face of front grooves 35F of the first drainage grooves 35, and the front inside face of the second drainage grooves 36 are connected in a straight line when viewed from above. Note that a groove portion that corresponds to the side grooves 35S of the communication groove 60 side formed in the first and second illustrative examples are not formed on the first drainage grooves 35. Specifically, the flat planar shape of the first drainage grooves 35 roughly forms a U-shape. In addition, a pair of inclined faces 64 that establishes a downward slope from the ridge line 65 towards the first drainage grooves 35 is formed on the bottom face of each of the communication grooves 63F and 63R. In this third illustrative example, because two communication grooves 63F and 63R are provided, the drainage efficiency is favorable. Note that because other components are the same as those in the second illustrative example described above, identical structures are denoted by identical reference numerals, and the explanations of the structures, the operations, and the effects thereof are omitted.

Other Illustrative Examples

The present invention is not limited by the illustrative examples that have been explained by the disclosure and the figures described above, and, for example, the following illustrative example are also included in the technical scope of the present invention.

(1) In the illustrative examples described above, the cover was formed such that the entire electrical connection box was enclosed by the supporting member and the bottom lid, but the cover may be formed to cover the top face side of the electrical connection box.

(2) In the illustrative examples described above, the drainage grooves were formed so as to enclose the parts accommodation portion, but the drainage grooves may be formed so as not to enclose the parts accommodation portion (formed along only one side of the parts accommodation portion, or disposed separated from the parts accommodation portion).

(3) In the third illustrative example described above, there were two communication grooves, but three or more communication grooves may be provided.

(4) In the illustrative examples described above, the outside peripheral face of the parts accommodation portion and the inside peripheral face of the first drainage grooves were continuously flush, but the outside peripheral face of the parts accommodation portion and the inside peripheral face of the first drainage grooves 35 may be formed so as to be connected in the form of a step.

(5) In the illustrative examples described above, a shape may be used in which the guiding portion is not formed.

(6) In the illustrative examples described above, a shape may be used in which the water barrier wall is not formed.

(7) In the illustrative examples described above, drainage channels were provided on the outside face of the case, but according to the present invention, a structure may be used in which such drainage channels are not formed.

(8) In the illustrative examples described above, the drainage channels had a through-hole shape, but according to the present invention, the drainage channels may also have a groove shape.

(9) In the illustrative examples described above, the drainage grooves and the drainage channels were formed in the fuse block, but according to the present invention, the drainage grooves and the drainage channels may be formed on a member other than the fuse block.

(10) In the illustrative examples described above, the tilting restricting portion on the electrical connection box side has a groove shape and the tilting restricting portion on the cover side has a projection shape, but according to the present invention, the tilting restricting portion on the electrical connection box side may have a projection shape and the tilting restricting portion on the cover side may have a groove shape.

(11) In the illustrative examples described above, a form is used in which an opening is provided on the bottom face of the supporting member that forms the cover and the electrical connection box is inserted into the supporting member from below, but according to the present invention, the opening of the cover may be provided on the top face or the side face.

(12) In the illustrative examples described above, the positioning portion (the tubular fitting portion) is disposed in the inside end portion of the attachment direction of the electrical connection box in the supporting member, but according to the present invention, the positioning portion may be disposed at a position more toward the opening side than the inside end of the supporting member.

(13) In the illustrative examples described above, among the supporting member and the bottom lid that form the cover, a fitting groove is provided on the bottom lid to position the electrical connection box above and below in two locations, but according to the present invention, a structure may be used in which a means to position the electrical connection box is provided only on the supporting members and the electrical connection box is positioned only at one location on the top end portion.

(14) In the illustrative examples described above, the positioning portion (accommodation portion) and the tilting restricting portions are formed on one member (the fuse block) that forms the case, but according to the present invention, the positioning portions and the tilting restricting portions for the electrical connection box may be formed on different members.

(15) In the illustrative examples described above, the positioning portion (accommodation portion) on the electrical connection box side is formed on the fuse block, but according to the present invention, the positioning portion may be formed on case forming members (the frame, the heat sink, or the cover) other than the fuse block.

(16) In the illustrative examples described above, the tilting restricting portions on the electrical connection box side are formed on the fuse block, but according to the present invention, the tilting restricting portion may be formed on case forming members (the frame, the heat sink, or the cover) other than the fuse block.

(17) In the illustrative examples described above, the tilting restricting portions and the rocking restricting portions on the electrical connection box side are disposed separately on the outside face and the inside face of the arm portions, but according to the present invention, the tilting restricting portion and the rocking restricting portion may be formed on only one of either the inside or outside face of the arm portions.

(18) In the illustrative examples described above, the tilting restricting portion is disposed at a viewable position in proximity to the opening of the supporting member, but according to the present invention, the tilting restricting portion may be positioned at a visually obscured position more inward than the opening of the supporting member.

(19) In the illustrative examples described above, the bottom face of the drainage grooves was an inclined face establishing a downward slope towards the outside face, but the bottom face of the drainage grooves may be a horizontal face.

(20) In the illustrative examples described above, a structure is used in which a plurality of drainage grooves extended to opposite sides to reach the outside face of the electrical connection box, but a structure may be used in which a plurality of drainage grooves extend in the same direction to reach the outside face electrical connection box.

(21) In the illustrative examples described above, the inclined face is formed along an entire drainage groove, but the inclined face may be formed only on a portion of a drainage groove.

The invention claimed is:

1. An electric power distribution system comprising:
   an electrical connection box, on a top face of which a parts accommodation portion is provided, that enables attaching and detaching of parts; and
   a cover that covers at least a portion of the electrical connection box that excludes said parts accommodation portion on the top face of the electrical connection box; wherein:
   a first drainage groove and a second drainage groove are provided in the top face of said electrical connection box, the first drainage groove is configured around an entire perimeter of the parts accommodation portion and the second drainage groove is configured to connect the first drainage groove to an outside of the electrical connection box.

2. The electrical power distribution system according to claim 1, including an inclined face that establishes a downward slope toward the outside face of said electrical connection box is formed on a bottom face of said drainage groove.

3. The electric power distribution system according to claim 1, wherein the outside face of said electrical connection box and an inside face of said drainage groove are formed flush and connected vertically.

4. The electrical power distribution system according to claim 1, wherein an inclined face of the first drainage groove and an inclined face of the second drainage groove having a constant angle from a topmost end to a bottommost end of the inclined faces.

5. The electrical power distribution system according to claim 1, wherein an inclined face of the first drainage groove and an inclined face of the second drainage groove having a different angle from a topmost end to a bottommost end of the inclined faces.

* * * * *